(12) United States Patent
Hartig

(10) Patent No.: US 7,678,198 B2
(45) Date of Patent: Mar. 16, 2010

(54) VERTICAL-OFFSET COATER

(75) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 1076 days.

(21) Appl. No.: 11/197,651

(22) Filed: Aug. 4, 2005

(65) Prior Publication Data

US 2006/0035021 A1 Feb. 16, 2006

Related U.S. Application Data

(60) Provisional application No. 60/600,923, filed on Aug. 12, 2004.

(51) Int. Cl.
| | |
|---|---|
| *C23C 14/00* | (2006.01) |
| *B05C 13/00* | (2006.01) |
| *C23C 16/00* | (2006.01) |
| *C25B 11/00* | (2006.01) |
| *C25B 13/00* | (2006.01) |

(52) U.S. Cl. .................. 118/729; 118/728; 118/50; 118/500; 204/298.01; 204/298.15; 204/298.23; 204/298.24

(58) Field of Classification Search ................ 165/48.1; 204/298.15, 298.25; 428/428; 118/50, 500, 118/728, 729

See application file for complete search history.

(56) References Cited

U.S. PATENT DOCUMENTS

| | | | |
|---|---|---|---|
| 3,942,967 A | 3/1976 | Jack et al. ...................... 65/114 |
| 4,194,962 A | 3/1980 | Chambers et al. ............ 204/298 |
| 4,765,273 A | 8/1988 | Anderle ....................... 118/729 |
| 4,780,190 A | 10/1988 | Vranken et al. ............. 204/298 |
| 4,890,714 A | 1/1990 | Brown .......................... 193/35 |
| 5,097,794 A | 3/1992 | Mahler et al. ............... 118/719 |
| 5,228,553 A | 7/1993 | Herrmann ................... 198/624 |
| 5,538,610 A | 7/1996 | Gesche et al. .......... 204/298.15 |
| 5,543,022 A * | 8/1996 | Nguyen et al. ......... 204/298.15 |
| 5,683,561 A | 11/1997 | Hollars et al. |
| 5,762,674 A | 6/1998 | Maltby, Jr. et al. |
| 6,919,001 B2 * | 7/2005 | Fairbairn et al. ....... 204/298.25 |
| 2002/0017377 A1 * | 2/2002 | Koguchi et al. ............. 165/48.1 |
| 2003/0059623 A1 * | 3/2003 | O'Shaughnessy et al. ... 428/428 |
| 2004/0089541 A1 | 5/2004 | Matsumoto et al. .... 204/298.08 |

FOREIGN PATENT DOCUMENTS

| | | | |
|---|---|---|---|
| DE | 198 26 949 A1 | | 12/1999 |
| JP | 2004083997 A | * | 3/2004 |
| WO | WO 00/37377 A1 | | 6/2000 |

* cited by examiner

*Primary Examiner*—Jennifer K Michener
*Assistant Examiner*—Michael Band
(74) *Attorney, Agent, or Firm*—Fredrikson & Byron, P.A.

(57) ABSTRACT

The invention provides a coater, and methods of using the coater, for depositing thin films onto generally-opposed major surfaces of a sheet-like substrate. The coater has a substrate transport system adapted for supporting the substrate in a vertical-offset configuration wherein the substrate is not in a perfectly vertical position but rather is offset from vertical by an acute angle. Preferably, the transport system includes a side support for supporting a rear major surface of the substrate. Preferably, the coater includes at least one coating apparatus (e.g., which is adapted for delivering coating material) on each of two sides of the path of substrate travel.

17 Claims, 10 Drawing Sheets

VERTICAL-OFFSET COATER

CROSS REFERENCE TO RELATED APPLICATIONS

The present application claims priority to provisional U.S. patent application filed Aug. 12, 2004 and assigned Ser. No. 60/600,923, the entire disclosure of which is incorporated herein by reference.

FIELD OF THE INVENTION

The present invention provides methods and equipment for depositing coatings on glass and other sheet-like substrates.

BACKGROUND OF THE INVENTION

A wide variety of coatings can be applied to glass sheets and other sheet-like substrates to provide the substrates with desired properties and characteristics. Well known coating types include low-emissivity coatings, solar control coatings, hydrophilic coatings, hydrophobic coatings, photocatalytic coatings, photovoltaic coatings, electrochromic coatings, mirror coatings, and antireflective coatings. In some cases, it is desirable to apply coatings to both sides of a sheet-like substrate. For example, a substrate may be provided with a low-emissivity coating on one side and a photocatalytic coating on the other side. Alternatively, a substrate may be provided with a low-emissivity coating on one side and a hydrophobic coating on the other side. Further, a substrate may be provided with a low-emissivity coating on one side and a hydrophilic coating (which may or may not be photocatalytic) on the other side. Still further, a substrate may be provided with a photocatalytic coating on one side and a mirror coating on the other side. Many further variants are possible.

When coatings are applied to both sides of a substrate, the coating deposition can be performed, for example, using a coater that is adapted only for downward deposition (e.g., using a coater adapted only for conventional downward sputtering). This can involve applying a coating to one side of the substrate in a first pass through the coater, and thereafter applying another coating to the other side of the substrate in a second pass through the coater, flipping the substrate between the first and second passes. Alternatively, one side of a substrate can be coated by conveying the substrate through a first coater (e.g., a coater adapted for pyrolytic deposition), and the other side of the substrate can be coated by subsequently conveying the substrate through a second coater (e.g., a coater adapted for sputter deposition). Such processes, however, are less than ideal in terms of efficiency and simplicity.

Attempts have been made to provide more efficient methods for coating both sides of a sheet-like substrate, generally by coating both sides of the substrate in a single pass through a single coating apparatus. Reference is made to U.S. Pat. No. 5,683,561 (Hollars et al.) and U.S. Pat. No. 5,762,674 (Maltby, Jr. et al.), the entire contents of each of which are incorporated herein by reference. Particularly useful technology for coating both sides of a substrate is disclosed in International Patent Application PCT/US99/02208 (International Publication No. WO 00/37377 (Bond et al.)), the entire contents of which are incorporated herein by reference.

While these recent technologies show great improvement over traditional methods, there is a need for other sophisticated technologies in which coatings are applied to both sides of a substrate. For example, with the rapid evolution of new coatings and ongoing advances in deposition equipment, there is a need for other efficient methods in which both sides of a substrate can be coated with high quality coatings. There is a particular need for technology in which both sides of a large-area substrate can be provided with pinhole-free coatings. This is especially true with respect to glass sheets and other large-area substrates designed for architectural and automotive glass applications.

SUMMARY OF THE INVENTION

In certain embodiments, the invention provides a method for depositing thin films onto generally-opposed major surfaces of a sheet-like substrate. The method comprises providing a coater having a substrate transport system adapted for maintaining the substrate in a vertical-offset configuration wherein the substrate is not in a perfectly vertical position but rather is offset from vertical by an acute angle. The transport system defines a path of substrate travel extending through the coater. The transport system includes a side support for supporting a rear surface that is one of the major surfaces of the substrate. The side support bounds a passage through which coating material passes when such coating material is deposited onto the substrate's rear major surface. Preferably, the coater includes at least one coating apparatus on each of two sides of the path of substrate travel. The method comprises: positioning the substrate on the transport system such that the substrate is maintained in the vertical-offset configuration; conveying the substrate along the path of substrate travel; and operating the coating apparatuses to deposit coatings onto both generally-opposed surfaces of the substrate in a single pass of the substrate along the path of travel.

In certain embodiments, the invention provides a coater for depositing thin films onto generally-opposed major surfaces of a sheet-like substrate in a single pass of the substrate through the coater. The coater has a substrate transport system adapted for supporting the substrate in a vertical-offset configuration wherein the substrate is not in a perfectly vertical position but rather is offset from vertical by an acute angle. The transport system defines a path of substrate travel extending through the coater. The transport system is adapted for conveying the substrate along the path of substrate travel while maintaining the substrate in the vertical-offset configuration. The transport system includes a side support for supporting a rear surface that is one of the major surfaces of the substrate. The side support bounds a passage through which coating material passes when such coating material is deposited onto the substrate's rear major surface. The coater includes at least one coating apparatus on each of two sides of the path of substrate travel. The coating apparatuses is adapted for depositing coatings onto both of the generally-opposed major surfaces of the substrate in a single pass of the substrate along the path of substrate travel.

In certain embodiments, the invention provides a method for depositing thin films onto generally-opposed major surfaces of a sheet-like, large-area substrate using a coater. In these embodiments, the large-area substrate has a major dimension of at least about 1 meter. The method comprises positioning the substrate on a substrate transport system such that the substrate is maintained in a vertical-offset configuration wherein the substrate is not in a perfectly vertical position but rather is offset from vertical by an acute angle. The transport system defines a path of substrate travel extending through the coater. The transport system has a side support comprising a plurality of support surfaces for supporting a rear major surface that is one of the major surfaces of the substrate. The side support bounds a plurality of passages each located between at least two of the support surfaces. The coater includes at least one coating apparatus on each of two sides of the path of substrate travel. The substrate is conveyed along the path of substrate travel while being maintained in the vertical-offset configuration. The coating apparatuses are operated so as to deposit coating material substantially entirely over both major surfaces of the substrate in a single pass of the substrate through the coater, some of the coating material being delivered through the passages and onto the substrate's rear major surface.

DETAILED DESCRIPTION OF THE PREFERRED EMBODIMENTS

Figure 1:
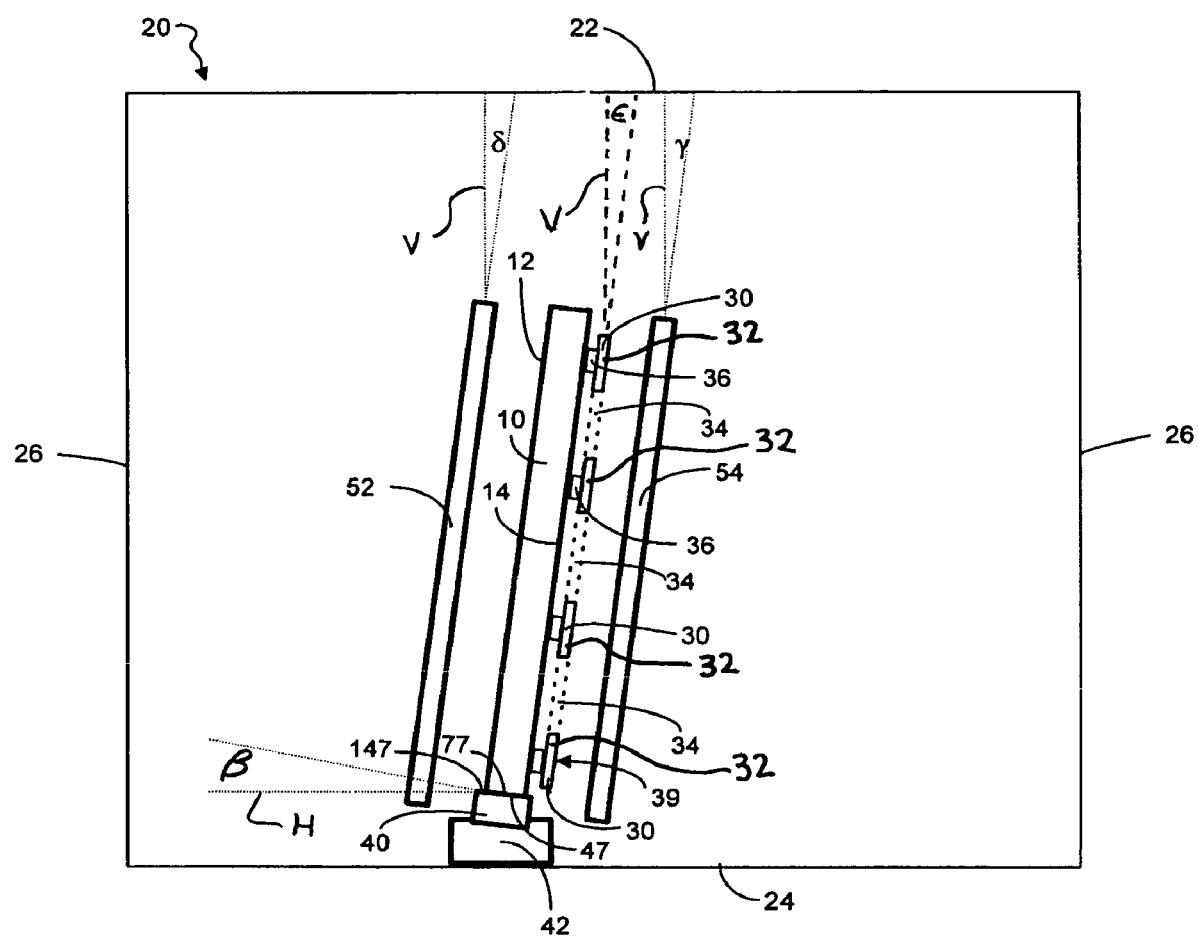
FIG. 1 is a schematic end view of a coater in accordance with certain embodiments of the invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

A variety of substrates are suitable for use in the present invention. In most cases, the substrate 10 is a sheet of transparent material (i.e., a transparent sheet). However, the substrate 10 is not required to be transparent. For example, opaque substrates may be useful in some cases. It is anticipated, however, that for most applications, the substrate will comprise a transparent or translucent material, such as glass or clear plastic. In many cases, the substrate 10 will be a glass pane. A variety of glass types can be used, and soda-lime glass is expected to be preferred.

Substrates of various sizes can be used in the present invention. Commonly, large-area substrates are used. Certain embodiments involve a substrate 10 having a major dimension (e.g., a width or length) of at least about 0.5 meter, preferably at least about 1 meter, perhaps more preferably at least about 1.5 meters (e.g., between about 2 meters and about 4 meters), and in some cases at least about 3 meters.

Substrates of various thicknesses can be used in the present invention. Commonly, substrates with a thickness of about 1-5 mm are used. Some embodiments involve a substrate 10 with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm is used.

Generally, the invention provides a vertical-offset coater and methods of using the coater to deposit coatings onto a sheet-like substrate. In certain embodiments, the coater and methods are used to deposit coatings onto generally-opposed surfaces of the substrate in a single pass of the substrate through the coater. In such embodiments, the manufacturer is able to apply high quality coatings to both major surfaces of the substrate in a very efficient manner. The resulting coatings are largely, if not entirely, free of unwanted pinholes and similar defects.

Thus, in certain embodiments, the invention provides a coater for depositing thin films onto generally-opposed major surfaces of a sheet-like substrate in a single pass of the substrate through the coater. The coater includes one or more deposition chambers, each preferably having a ceiling 22, floor 24, and one or more side walls 26.

As is perhaps best illustrated in FIGS. 3, 6-7, and 10, the coater 20 includes a substrate transport system 170. Preferably, the transport system 170 is adapted for maintaining the substrate in a vertical-offset configuration wherein the substrate 10 is not in a perfectly vertical position but rather is offset from vertical by an acute angle $\alpha$. The vertical-offset configuration of the substrate is perhaps best appreciated with reference to FIG. 4. The angle $\alpha$ is preferably less than about 25 degrees, perhaps more preferably less than about 15 degrees, and perhaps optimally less than about 10 degrees. In certain embodiments, the angle $\alpha$ is between about 5 degrees and about 10 degrees. One embodiment involves an angle $\alpha$ of about 7 degrees.

Figure 7:
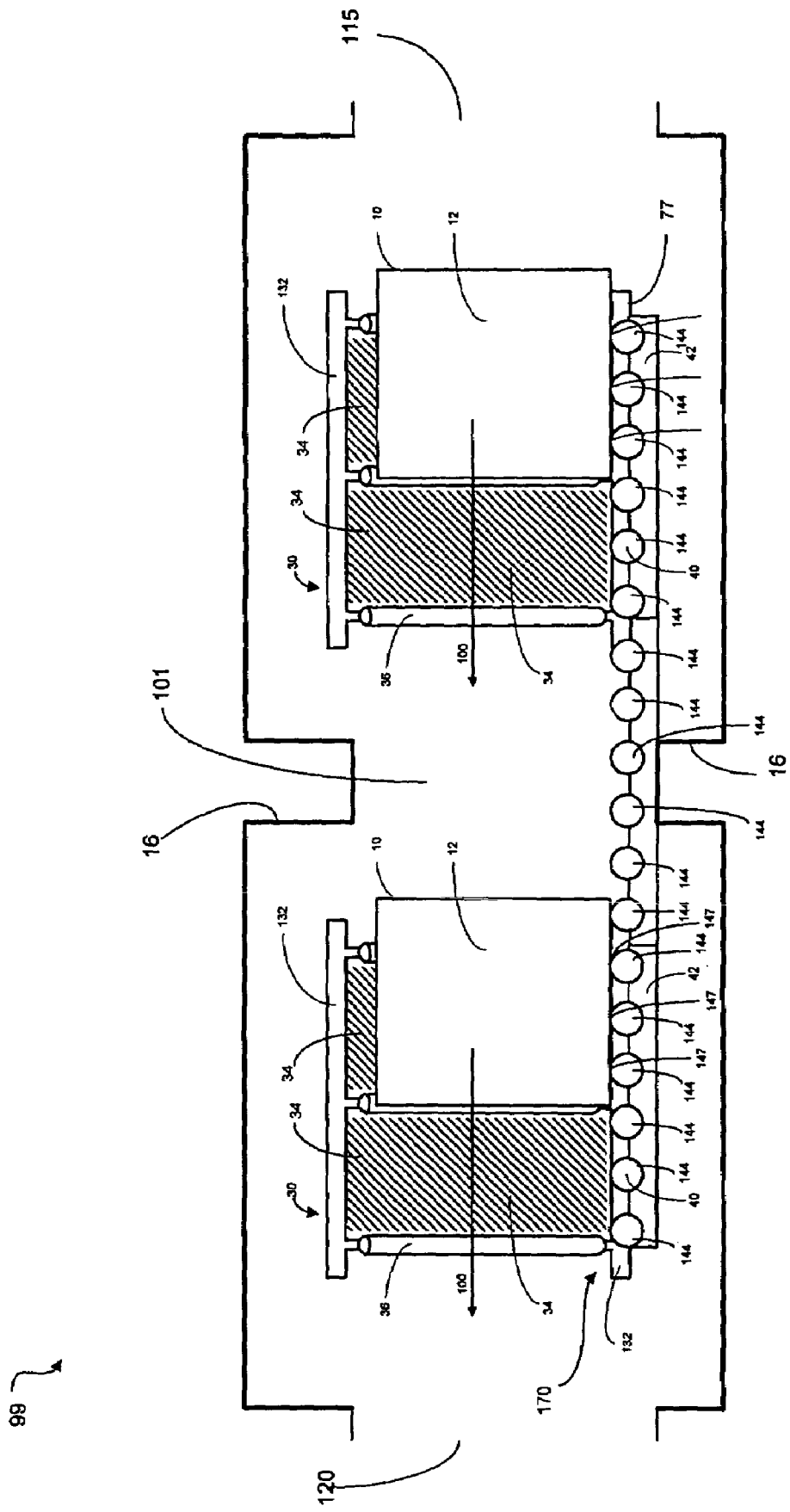
FIG. 7 is a schematic front view of two substrates being conveyed along a transport system extending through a coater in accordance with certain embodiments of the invention.
Figure 8:
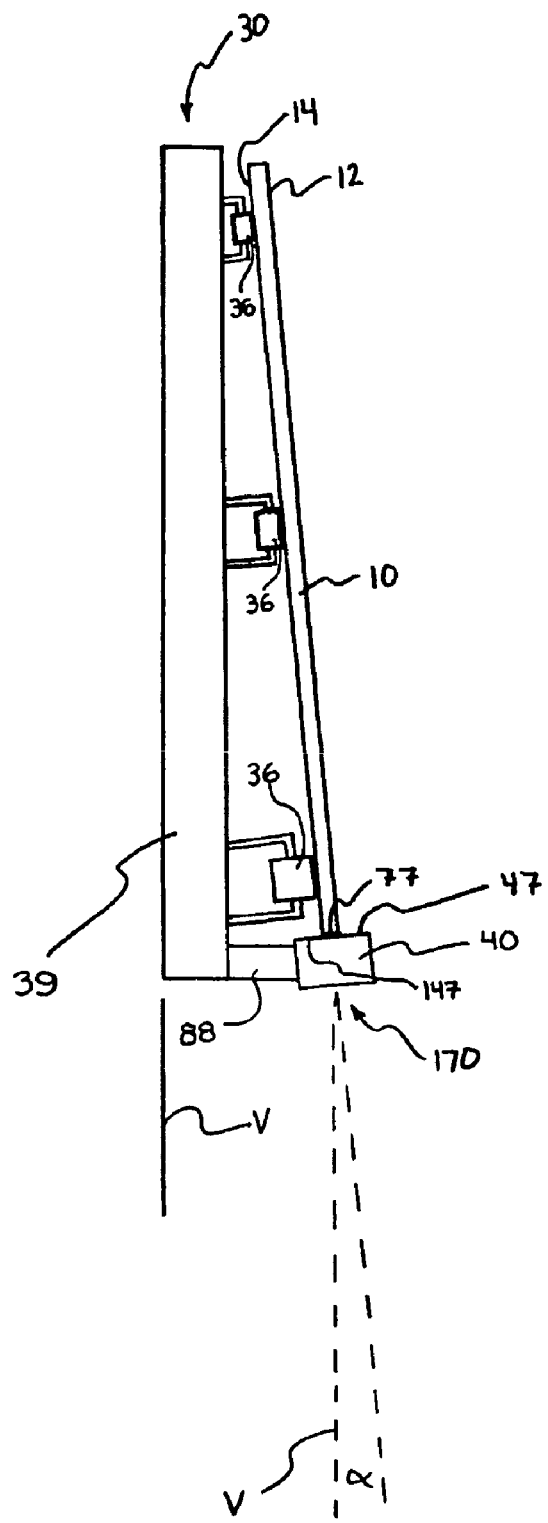
FIG. 8 is a schematic end view of a coater in accordance with certain embodiments of the invention.
Figure 9:
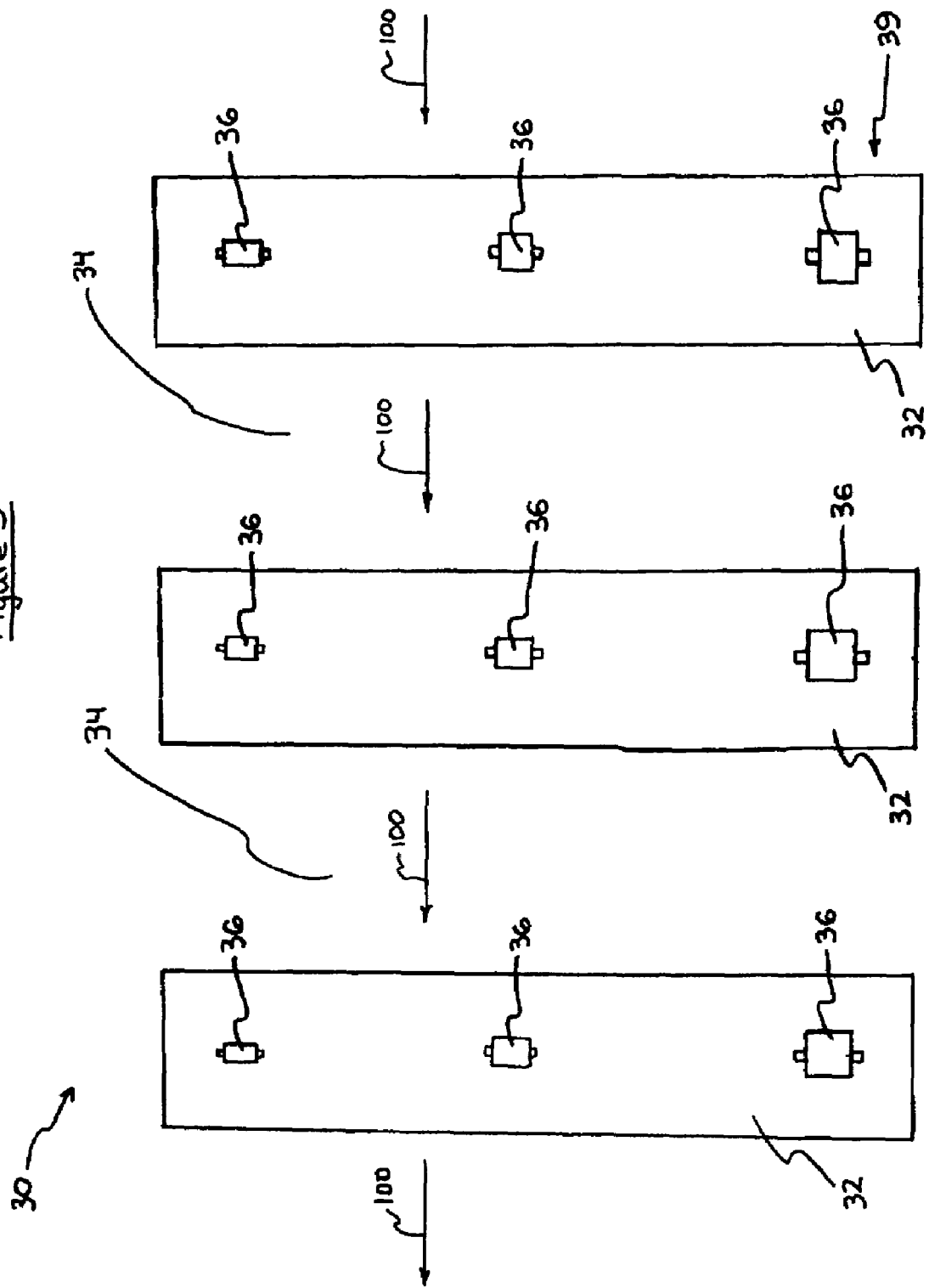
FIG. 9 is a schematic front view of a side support in accordance with certain embodiments of the invention.

The transport system 170 defines a path of substrate travel 100 extending through the coater 20. Preferably, the path of substrate travel 100 extends between a coater inlet 115 and a coater outlet 120, as is best seen in FIG. 7. The transport system 170 preferably is adapted for moving (e.g., conveying) the substrate 10 along the path of substrate travel 100 while maintaining the substrate 10 in the vertical-offset configuration. Thus, the transport system 170 preferably includes a side support 30 and a bottom conveyor 40.

When the substrate 10 is conveyed through the coater 20 on the transport system 170, the substrate's rear major surface 14 is supported by (e.g., is in direct physical contact with) the side support 30. The side support 30 can be provided in a variety of different forms. For example, it can comprise a framework 132 and/or a platen 39. FIGS. 1-3 and 8-9 exemplify certain embodiments wherein the side support comprises a platen 39, and FIGS. 4-7 and 10 exemplify certain embodiments wherein the side support comprises a framework 132.

As is perhaps best understood with reference to FIGS. 2, 5, 9, and 10, the side support 30 preferably bounds at least one passage 34 through which coating material passes when such coating material is deposited onto the substrate's rear surface 14. With reference to FIG. 1 in view of FIG. 2, for example, it can be appreciated that the shadowed area 34 is space defining such a passage 34. In some embodiments, the side support 30 bounds a plurality of passages 34 of the described nature. For example, the side support 30 may bound a series of passages 34 past which the substrate 10 is conveyed sequentially as it moves along the path of substrate travel 100. In certain embodiments, the side support 30 defines at least one passage 34 having a vertical dimension that is at least as great as, and perhaps optimally greater than, a vertical dimension of the substrate 10 when the substrate is in the vertical-offset configuration, such that it is possible to achieve full-area coating of the substrate's rear major surface 14.

Figure 2:
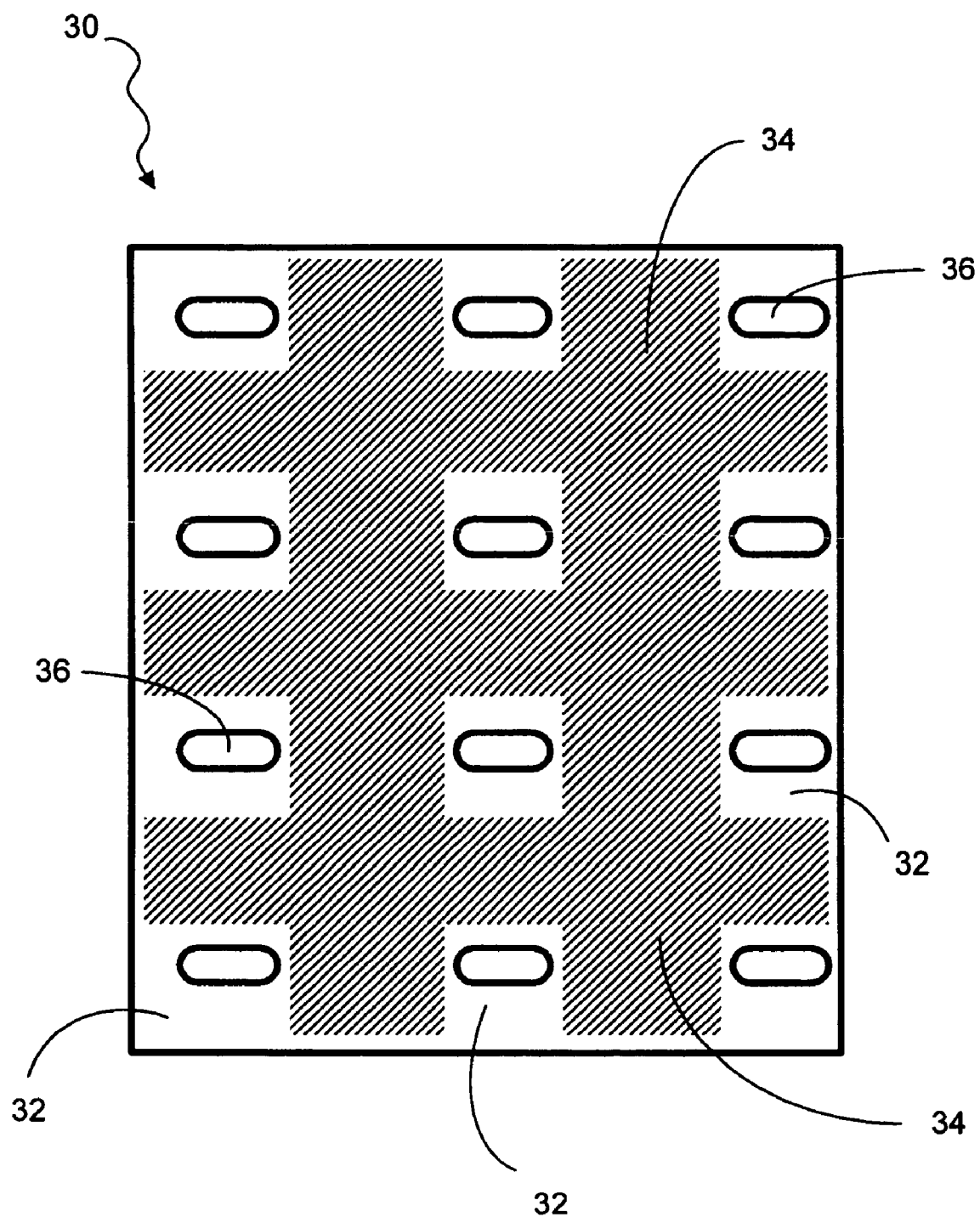
FIG. 2 is a schematic front view of a side support in accordance with certain embodiments of the invention.
Figure 3:
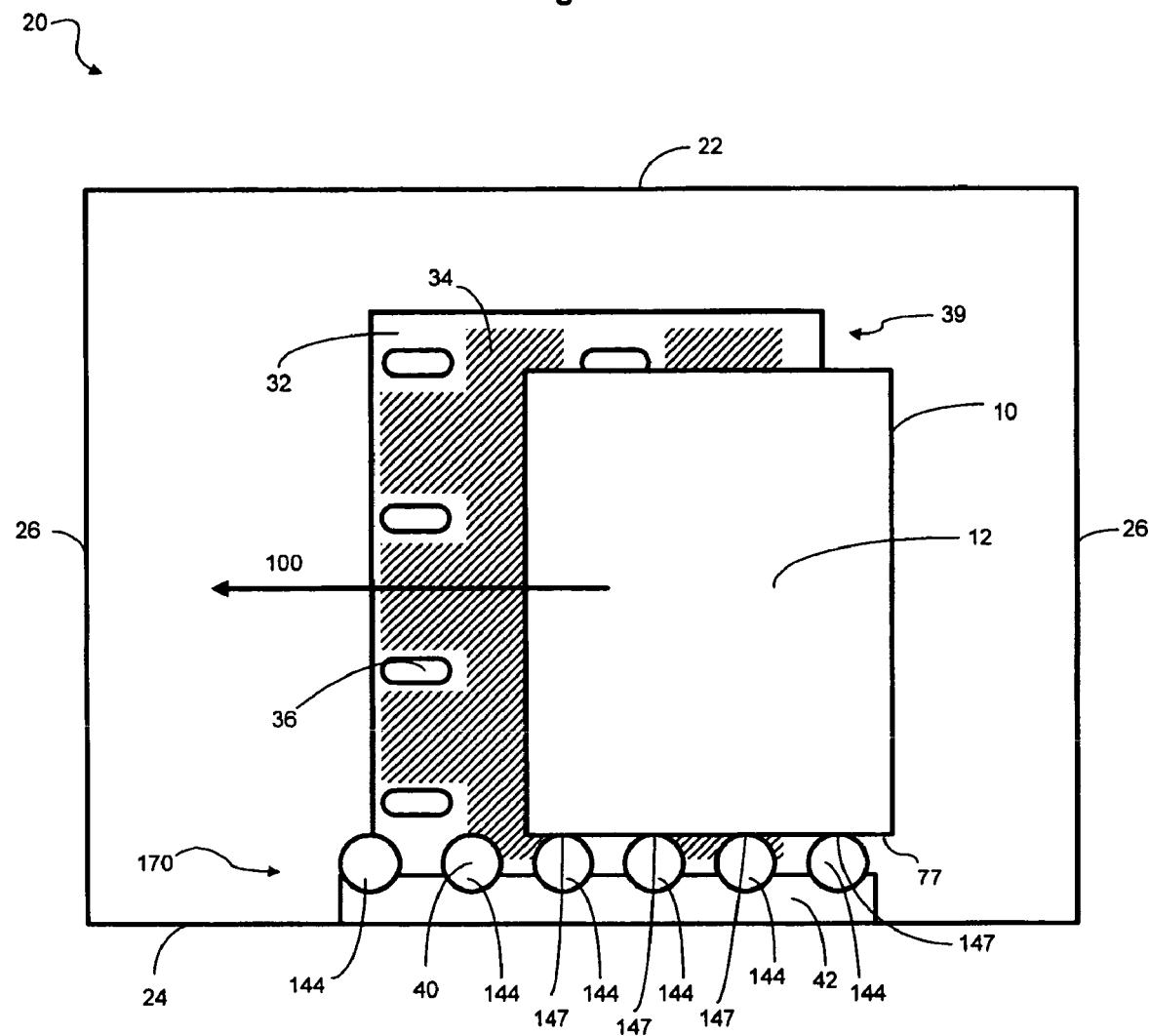
FIG. 3 is a schematic front view of a substrate being conveyed along a transport system extending through a coater in accordance with certain embodiments of the invention.

The side support 30 preferably comprises a plurality of rotatable bodies 36 adapted to roll against the substrate's rear surface 14 when the substrate 10 is conveyed along the path of substrate travel 100. The rotatable bodies 36 preferably are mounted in a fixed position relative to (e.g. on) the side support 30. For example, each rotatable body 36 preferably is mounted in a fixed location where it is adapted to rotate about a vertical or generally vertical axis. As shown in FIG. 2, the side support 30 can comprise a plurality of rotatable wheels 36. For example, one or more of the rotatable bodies 36 can be wheels. Such wheels 36 can be provided as an arrangement (a matrix, line, etc.) wherein the wheels 36 are spaced vertically and/or horizontally from one another. Preferably, such wheels 36 are oriented so their direction of rotation corresponds to the desired direction of substrate travel (e.g., such wheels 36 preferably are adapted for rotation about a common axis). In FIG. 2, each wheel 36 is mounted on a wall section 32 of the side support 30. This exemplifies a class of embodiments wherein a passage 34 (or a portion of a passage 34) is located between adjacent wall sections 32 and/or adjacent wheels 36 of the side support 30.

Preferably, the side support 30 is mounted inside the coater 20. In certain embodiments, the side support 30 is mounted at an angle $\epsilon$ offset from vertical. In these embodiments, when the substrate's rear surface 14 is supported by (e.g., rests directly against support surfaces of) the side support 30, the substrate 10 is maintained in the vertical-offset configuration. The side support 30 (e.g., a platen or generally-planar framework thereof) desirably is mounted at an angle $\epsilon$ offset from vertical by less than 90 degrees. Preferably, the angle $\epsilon$ is less than about 25 degrees, perhaps more preferably less than about 15 degrees, and perhaps optimally less than about 10 degrees. In certain preferred embodiments, the angle $\epsilon$ is substantially equal to the angle $\alpha$ of the substrate when in the vertical-offset configuration.

In embodiments wherein the side support 30 comprises a platen 39, the platen preferably bounds the passage(s) 34 through which coating material passes when the substrate's rear surface 14 is coated. The platen 39 can comprise a generally-planar wall. In such embodiments, the platen can comprise a wall that defines (e.g., entirely surrounds) apertures that serve as the passage(s) 34. Alternatively or additionally, the platen can comprise a wall formed, at least in part, by a plurality of wall sections 32. The wall sections 32 can collectively bound the passage(s) 34. Embodiments of this nature are exemplified in FIGS. 2 and 9. If so desired, the platen 39 can comprise adjacent wall sections 32 separated by a gap (optionally extending entirely across the wall, e.g., generally vertically) that serves as a coating passage 34. This is perhaps best appreciated with reference to FIG. 9.

In alternate embodiments, the side support 30 comprises a platen 39 that is mounted in a vertical configuration. One embodiment of this nature is exemplified in FIG. 8. Here, a plurality of rotatable bodies 36 project varying distances from the platen 39 such that when the substrate 10 is supported collectively by (e.g., leans directly against) the rotatable bodies 36, the substrate is maintained in the vertical-offset configuration. For example, a series of lower rotatable bodies can be mounted on such a platen so as to extend relatively far from the platen, while a series of upper rotatable bodies can be mounted on such a platen to extend a lesser distance from the platen than do the lower rotatable bodies.

Figure 4:
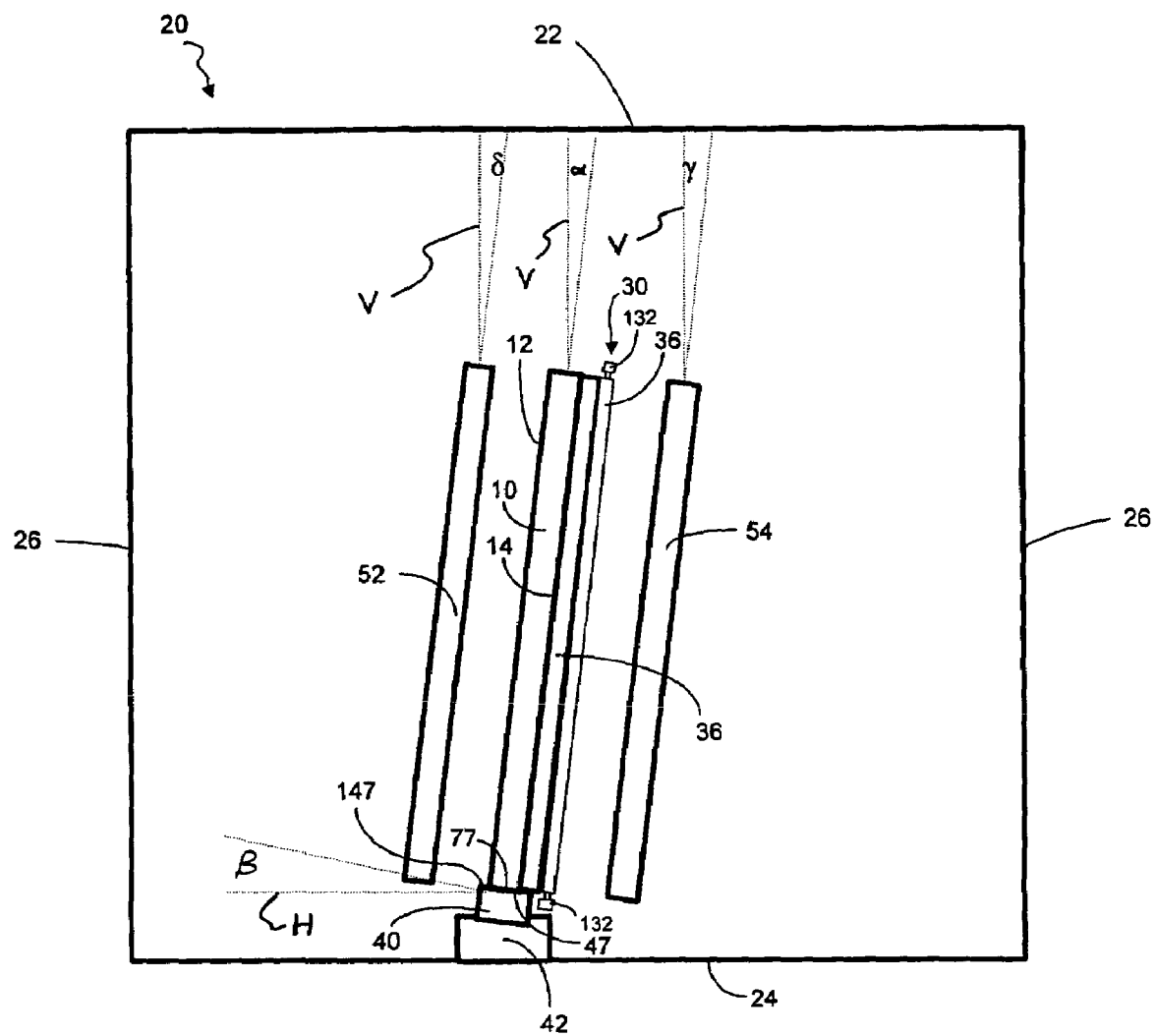
FIG. 4 is a schematic end view of a coater in accordance with certain embodiments of the invention.
Figure 5:
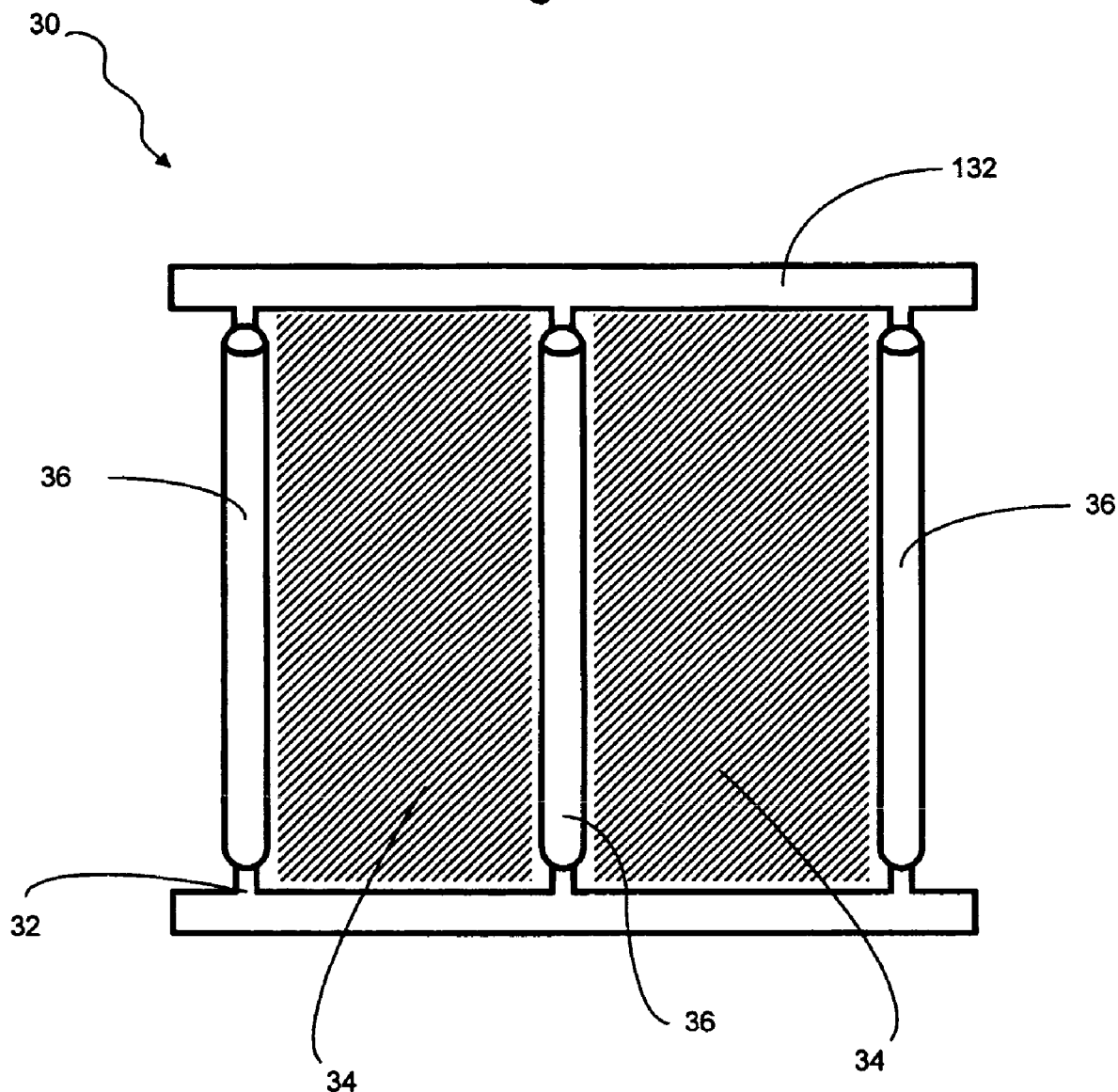
FIG. 5 is a schematic front view of a side support in accordance with certain embodiments of the invention.
Figure 6:
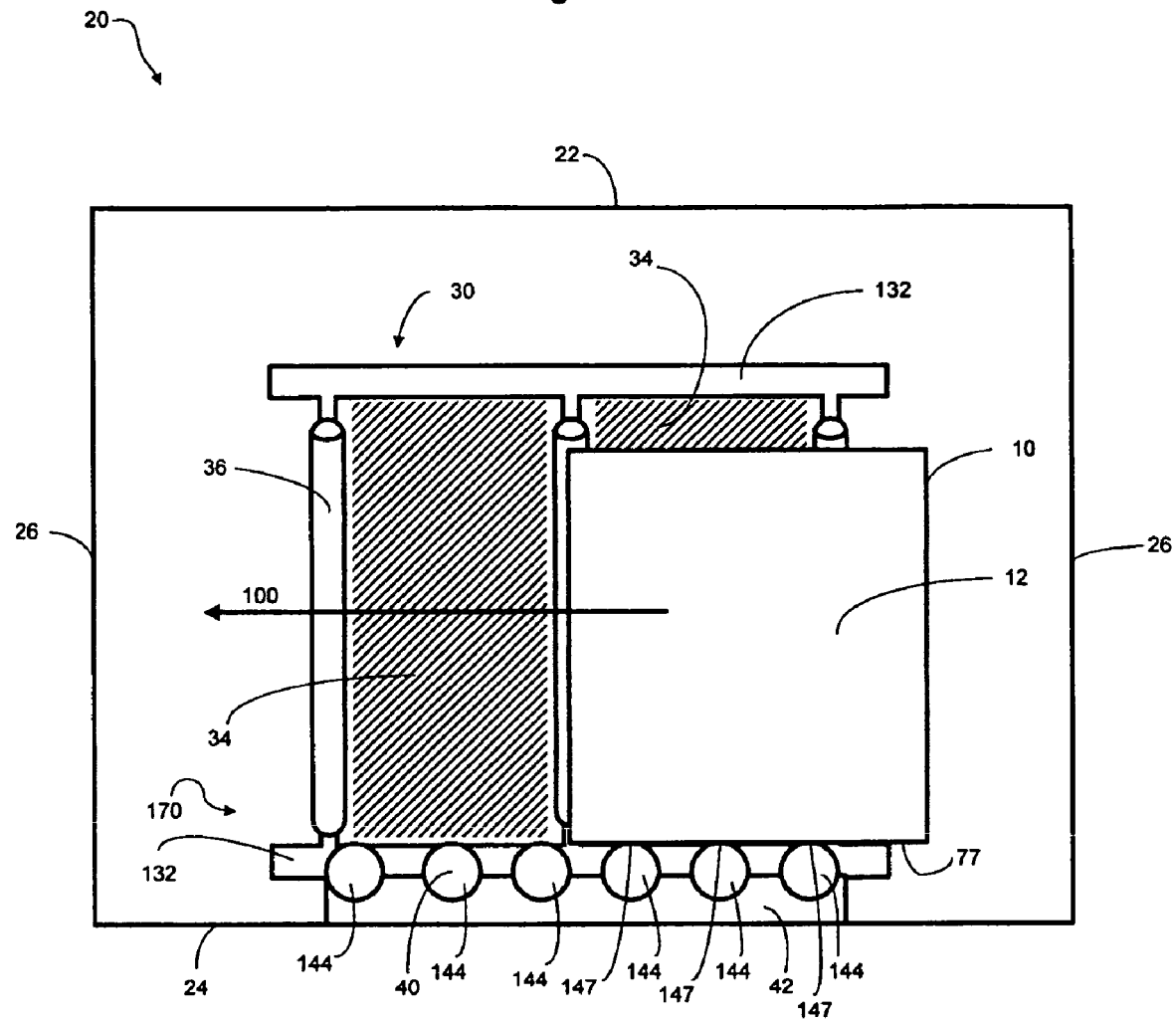
FIG. 6 is a schematic front view of a substrate being conveyed along a transport system extending through a coater in accordance with certain embodiments of the invention.

As noted above, the side support 30 in some embodiments comprises a framework (e.g., one or more beams, rails, or other frame members) 132. Embodiments of this nature are perhaps best appreciated with reference to FIGS. 4-7 and 10. In these embodiments, the framework 132 preferably is provided with (or adjacent) the rotatable bodies 36. In embodiments like those exemplified in FIG. 5, the side support 30 includes one or more rollers 36 adapted to roll against the substrate's rear major surface 14 when the substrate is conveyed along the path of substrate travel 100. Such rollers are preferably oriented so their direction of rotation corresponds to the desired direction of substrate travel. The illustrated rollers each comprise an elongated cylindrical body. In FIG. 4, each roller is mounted for rotation about an axis that is offset from vertical by an angle $\epsilon$ of less than 90 degrees. Preferably, the angle $\epsilon$ is less than about 25 degrees, perhaps more preferably less than about 15 degrees, and perhaps optimally less than about 10 degrees. In some embodiments, the axis of rotation of each such roller is offset from vertical by an angle $\epsilon$ that is substantially equal to, or substantially equal to, the angle $\alpha$ of the substrate 10 when the substrate is in the vertical-offset configuration. In one such embodiment, this common angle is about 7 degrees.

When the substrate 10 is supported by (e.g., leans against) the side support 30, at least some of the substrate's rear surface 14 is exposed (e.g., to coating material being delivered to the substrate's rear surface from a rear coating apparatus 54 further from the substrate 10 than the side support 30) by the passage(s) 34. As noted above, coating material can be deposited through the passage(s) 34 and onto the substrate's rear surface 14. This is possible due to the relative positioning of the substrate 10, the side support 30 (and the passage(s) 34 in particular), and the rear coating apparatus(es) 54. Preferably, the side support (e.g., at least those portions adapted for supporting the substrate's rear surface during conveyance) is positioned between the path of substrate travel 100 and at least one rear coating apparatus 54. Similarly, when the substrate is in a desired coating position on the transport system (i.e., when the substrate is being coated by operating at least one rear coating apparatus), the side support 30 preferably is positioned between the substrate 10 and at least one rear coating apparatus 54. This is perhaps best appreciated with reference to FIGS. 1 and 4. The passage(s) 34 allow coating to be deposited onto the substrate's rear surface 14 while the substrate is supported by the side support 30. Preferably, when the substrate 10 is in such a desired coating position, at least one rear coating apparatus 54 is aligned with a passage 34 of the side support 30.

The rotatable bodies 36 of the side support 30 preferably comprise (e.g., are formed of) material adapted to withstand vacuum deposition conditions. In some cases, the rotatable bodies 36 comprise (e.g., have an outer surface formed of, consisting essentially of, or at least comprising) carbon and/or another carbon-containing material. Carbon is particularly non-damaging to coated substrates and thus helps prevent removal of, and other damage to, coating on the substrate's rear surface during conveyance of the substrate through the coater.

The transport system 170 preferably includes a bottom conveyor 40 adapted for receiving (and supporting) a bottom edge 77 of the substrate 10. Preferably, the substrate 10 when positioned on the transport system 170 and maintained in the vertical-offset configuration has its bottom edge 77 supported by the bottom conveyor 40 and its rear major surface 14 supported by the side support 30. With the substrate so positioned, the bottom conveyor 40 preferably is adapted to move (e.g., convey) the substrate 10 through the coater 20 along the path of substrate travel 100 (while maintaining the substrate in the vertical-offset configuration).

The bottom conveyor 40 can comprise any device (e.g., a conveyor belt and/or a series of rotatable members) that is adapted to support the substrate's bottom edge 77 while allowing the substrate 10 to move along the path of substrate travel 100. Preferably, the bottom conveyor 40 is motorized, such that the conveyor 40 is adapted to drive the substrate 10 along the path of substrate travel 100. In some embodiments, the conveyor system 40 comprises a series of rotatable members 144. The rotatable members are preferably positioned along (e.g., entirely along) the path of substrate travel 100. In certain methods of the invention, at least one such rotatable member is made to rotate by energizing a motor operably connected to such member, so that when the bottom edge 77 of the substrate 10 rests directly on such member, friction between the rotating member and the substrate's bottom edge 77 causes the substrate 10 to move along the path of substrate travel 100. Thus, when the substrate 10 is conveyed along the path of substrate travel, the substrate's bottom edge 77 can optionally be in direct contact with such rotatable members 144 and/or with a conveyor belt or the like disposed over such rotatable members 144.

In certain embodiments, the bottom conveyor 40 defines a support platform 47 that is not perfectly horizontal but rather is offset from horizontal H by an angle β of less than 90 degrees. In some embodiments, the angle β is less than about 25 degrees, perhaps more preferably less than about 15 degrees, and perhaps optimally less than about 10 degrees. In certain preferred embodiments, the angle β is substantially equal to the angle α of the substrate 10 when in the vertical-offset configuration.

Thus, certain embodiments involve a support platform 47 that is defined by the bottom conveyor 40 and comprises one or more support surfaces 147 on which the substrate's bottom edge 77 is physically supported during conveyance. In certain embodiments, a conveyor belt defines the support platform 47 (and the support surface 147) on which the substrate rests. In other embodiments, surfaces of a series of rotatable members 144 collectively define the support platform 147. In some embodiments of this nature, each rotatable member 144 has a support surface 147, and the support surfaces 147 of the rotatable members lie in a common plane (e.g., which can optionally be offset from vertical by the angle β).

Figure 10:
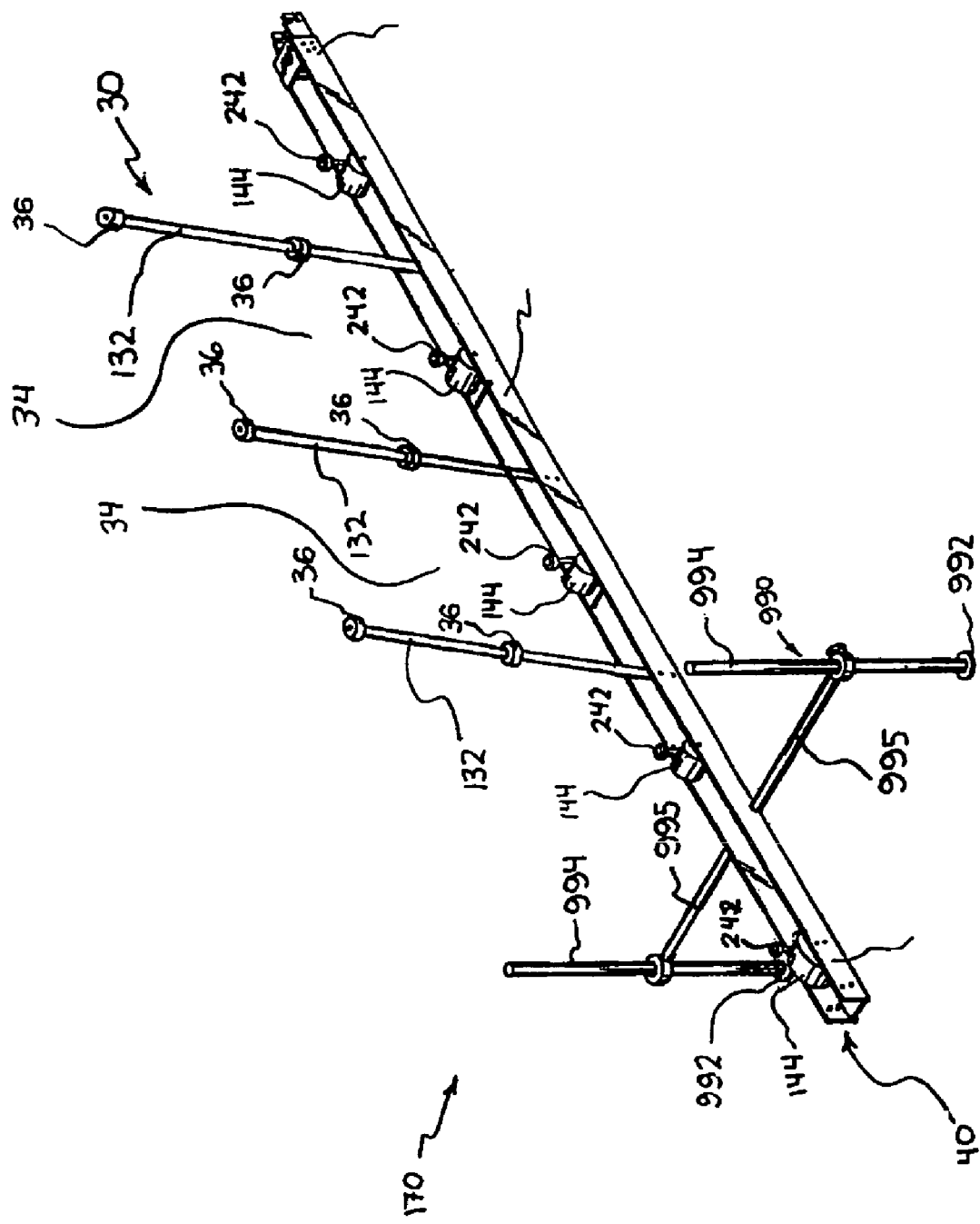
FIG. 10 is a schematic perspective view of a transport system in accordance with certain embodiments of the invention.

While certain preferred embodiments of the invention involve a bottom conveyor 40 that is not perfectly horizontal, the invention includes embodiments wherein the bottom conveyor 40 simply lies in a horizontal plane. In these embodiments, the substrate preferably is maintained in the vertical-offset configuration when it is conveyed along the path of substrate travel (e.g., the side support 30 can be at an incline appropriate to support the substrate in the vertical-offset configuration). Embodiments of this nature may involve front wheels (e.g., adjacent a front portion of the bottom conveyor 40) adapted to engage and support a bottom peripheral region of the substrate's front major surface 12. Exemplary front wheels 242 are shown in FIG. 10.

In certain embodiments, the substrate 10 is a sheet of glass having its bottom edge 77 supported by the bottom conveyor 40 while the substrate is conveyed along the path of substrate travel. In some cases, other sheets of glass are also positioned on the bottom conveyor 40, the sheets of glass being spaced apart from one another on the bottom conveyor 40 and conveyed in such a spaced-apart arrangement. Each substrate 10 is typically conveyed through the chamber 20 at a speed of between about 100 and about 500 inches per minute. Thus, in certain methods, the substrate is conveyed along the path of substrate travel, and this conveyance involves moving the substrate at a speed of between about 100-500 inches per minute. While the illustrated bottom conveyor 40 comprises a plurality of rotatable members 144, various types of conveyor systems can be used.

The invention is particularly advantageous for processing large-area substrates, such as glass sheets for architectural and automotive glass applications. Thus, in certain methods of the invention, the substrate 10 conveyed through the coater 20 is a large-area substrate having a major dimension of at least about 1 meter.

The coater 20 includes at least one coating apparatus on each of two sides of the path of substrate travel 100. Preferably, at least one coating apparatus 52 is provided on a front side of the path of substrate travel. This front coating apparatus 52 is adapted for depositing film onto the substrate's front major surface 12. Conjointly, at least one coating apparatus 54 preferably is provided on a rear side of the path of substrate travel. This rear coating apparatus 54 is adapted for depositing film onto the substrate's rear major surface 14. Preferably, the rear coating apparatus 54 is behind the side support 30 (e.g., the rear coating apparatus 54 and the path of substrate travel preferably are on opposite sides of the side support) and is configured for emitting coating material that passes through the passage(s) 34 onto the substrate's rear major surface 14. This is perhaps best appreciated with reference to FIGS. 1 and 4. In some embodiments, a single coating apparatus is on each side of the path of substrate travel 100, although any number of coating apparatuses can be provided on each side of this path 100. Preferably, each coating apparatus (or at least the portion adapted for emitting coating material) is mounted inside the coater 20.

The coater 20 is adapted for carrying out one or more thin film deposition processes. In preferred embodiments, the coater 20 comprises a vacuum deposition chamber in which a controlled vacuous environment can be established. In such embodiments, the vacuum deposition chamber is adapted for use at (e.g., is adapted for establishing and maintaining therein) a total gas pressure of less than about 140 torr., more preferably less than about 0.1 torr., and perhaps optimally between about 1 mtorr. and about 0.1 torr. (e.g., between about 1 mtorr. and about 30 mtorr.). Thus, the coater 20 preferably has gas delivery and pumping systems adapted for establishing and maintaining such pressures. In certain embodiments, the coater 20 is adapted for carrying out at least one vacuum deposition process (e.g., selected from the group consisting of sputtering, chemical vapor deposition, and ion-assisted deposition).

In certain embodiments, the coater 20 comprises at least one vacuum deposition chamber and at least one of the coating apparatuses 52, 54 is a vacuum deposition device. Each such vacuum deposition device preferably is mounted (at least in part) inside the coater 20 at a location on a desired side of the path of substrate travel 100. In some cases, each such device is adapted for emitting coating material in a generally sideways fashion onto a desired major surface of the vertically-offset substrate.

In certain embodiments, the coater 20 comprises at least one sputter deposition chamber and at least one of the coating apparatuses 52, 54 comprises a sputtering target. In such embodiments, the sputtering target can be cylindrical or planar. Preferably, each such sputtering target includes a magnet assembly adapted to facilitate magnetron sputtering. In certain preferred embodiments, the coater 20 includes a sputtering target mounted adjacent to (e.g., aligned with) a passage 34 such that bombarding the target with ions causes particles of sputtered material to be ejected from the target through the passage 34 and onto the substrate's rear major surface 14.

In certain embodiments, the coater 20 comprise at least one chemical vapor deposition (CVD) chamber and at least one of the coating apparatuses 52, 54 comprises a CVD device. Each such CVD device can comprise a gas delivery system adapted for delivering precursor gas into the coater. Preferably, each such device comprises a gas-delivery outlet inside the coater, such that from the precursor gas coating material condenses upon the substrate 10. In more detail, each such CVD device will typically comprise a gas supply from which precursor gas is delivered through a gas line, out of the gas outlet, and into the chamber. If so desired, one or more plasma-enhanced CVD devices can be used. In embodiments wherein a CVD device is used to coat the substrate's rear surface 14, the device can be configured in the chamber so as to direct precursor fluid (e.g., gas and/or liquid) through a passage 34 and onto the substrate's rear surface 14.

In certain embodiments, the coater 20 is adapted for ion-assisted deposition and at least one of the coating apparatuses 52, 54 comprises an ion gun. Generally, such an ion gun can be adapted for carrying out any desired ion-assisted deposition (IAD) process. For example, such an ion gun can be adapted for direct film deposition. Alternatively, such an ion gun can be part of an ion beam sputter deposition source comprising a sputtering target against which the ion gun accelerates ions, such that atoms of the target material are ejected from the target toward a desired major surface of the substrate. Other types of IAD methods can also be used.

In many cases, the coater 20 will comprise a series of deposition chambers. FIG. 7 exemplifies one such embodiment. The coater 20 can comprise virtually any number of chambers. Thus, the coater may have a single deposition chamber or it may comprise a line of connected deposition chambers (i.e., a coating line). In more detail, such a coating line may comprise a series of deposition chambers aligned and connected so that a substrate maintained in the vertical-offset configuration can be conveyed sequentially through the chambers of the coater. During coating deposition, the substrate is typically conveyed through all the deposition chambers of such a coater. It is to be appreciated that the coater 20 can include a plurality of deposition chambers aligned and connected in this manner, regardless of the particular deposition processes that are performed in such chambers.

In embodiments wherein the coater 20 includes more than one deposition chamber, the chambers are typically connected such that the path of substrate travel 100 extends through each of the deposition chambers. FIG. 7 exemplifies an embodiment wherein the path of substrate travel 100 extends between a coater inlet 115 and a coater outlet 120. Preferably, the path of substrate travel 100 extends horizontally through the coater 20.

The coater 20 can include different deposition chambers adapted for carrying out different deposition processes. For example, the coater can include one or more chambers in which sputtering is performed and one or more chambers in which ion-assisted deposition is performed. Further, the coater 20 can include one or more chambers in which sputtering is performed and one or more chambers in which chemical vapor deposition is performed. Various alternatives of this nature will be apparent to skilled artisans given the present teaching as a guide.

The invention also provides methods for depositing thin films onto generally-opposed major surfaces of a sheet-like substrate. There is provided a coater 20 of the described nature. Preferably, the coater has a substrate transport system adapted for maintaining the substrate in a vertical-offset configuration wherein the substrate is not in a perfectly vertical position but rather is offset from vertical by an acute angle. The preferred transport system defines a path of substrate travel extending through the coater. The preferred transport system also includes a side support for supporting a rear surface that is one of the major surfaces of the substrate. The preferred side support bounds a passage through which coating material passes when such coating material is deposited onto the substrate's rear major surface. The coater 20 desirably includes at least one coating apparatus on each of two sides of the path of substrate travel.

Preferably, at least one of the coating apparatuses is a rear coating apparatus, and the operation of the coating apparatuses involves operating the rear coating apparatus(es) so as to deliver coating material through the passage(s) 34 and onto the substrate's rear major surface 14. In certain optional embodiments, the side support 30 bounds a plurality of passages and such coating material is delivered through these passages and onto the substrate's rear major surface 14. In some particularly preferred embodiments, one of the coating apparatuses is a rear coating apparatus that is aligned with a desired passage 34, the conveyance of the substrate along the path of substrate travel involves bringing the substrate into a position where the desired passage 34 is between this rear coating apparatus and the substrate's rear major surface 14, and the operation of the coating apparatuses involves operating this rear coating apparatus so as to deliver coating material through the desired passage 34 and onto the substrate's rear major surface 14.

The present methods, in certain embodiments, include positioning the substrate on the transport system such that the substrate is maintained in the vertical-offset configuration. The substrate 10 is conveyed along the path of substrate travel 100 (preferably while maintained in the vertical-offset configuration). In preferred methods, the coating apparatus(es) are operated (e.g., as the substrate is being conveyed) so as to deposit coatings onto both generally-opposed major surfaces of the substrate in a single pass of the substrate along the path of substrate travel.

The preferred transport system includes a bottom conveyor adapted for receiving a bottom edge of the substrate, wherein the substrate when positioned on the transport system and maintained in the vertical-offset configuration has its bottom edge supported by the bottom conveyor and its rear major surface supported by the side support. Thus, in preferred methods, the substrate is maintained in the vertical-offset configuration during the conveyance of the substrate along the path of substrate travel.

In certain preferred methods, the coatings are deposited entirely over both major surfaces of the substrate to achieve full-area coating of both major surfaces. Further, one of the coatings preferably is a rear coating on the rear major surface of the substrate, and this rear coating preferably comes into contact with the side support 30 during the conveyance of the substrate along the path of substrate travel. As noted above, the side support preferably comprises a plurality of rotatable bodies (e.g., wheels in some embodiments) that roll against the rear major surface of the substrate during said conveying the substrate along the path of substrate travel.

Preferably, at least one coating apparatus 54 behind the side support 30 is operated to deliver coating material through at least one passage 34 (bounded by the side support 30) and onto the rear surface 14 of the substrate 10. In some cases, at least one of the coating apparatuses (e.g., at least one rear coating apparatus 54) is a sputtering target and is operated by bombarding the target with ions so as to eject particles of sputtered material from the target, through at least one passage 34, and onto the rear surface 14 of the substrate. In these embodiments, the operation of the coating apparatus(es)

involves bombarding a rear target with ions so as to eject particles of sputtered material from the target, through the passage(s) 34, and onto the substrate's rear major surface 14. In some preferred embodiments, the coater 20 includes both front 52 and rear 54 coating apparatuses that comprise sputtering targets and the apparatuses are operated by bombarding the front and rear targets with ions so as to eject particles of sputtered material: (1) from at least one front target towards (and onto) the substrate's front surface 12; and (2) from at least one rear target, through at least one passage 54, and onto the rear substrate's rear surface 14.

As noted above, the coater 20 in certain embodiments comprises a vacuum deposition chamber. In related methods of operating such a coater 20, a controlled vacuous environment is maintained in such vacuum chamber during the operation of the coating apparatuses.

In certain embodiments, the coatings deposited onto the major surfaces 12, 14 of the substrate each have a total physical thickness of less than about 2000 angstroms. In some cases, the coating deposited on one of the major surfaces has a greater total physical thickness than the coating deposited on the other major surface. For example, the coating apparatuses 52, 54 can be operated so as to deposit: (1) a first coating on the substrate's front surface 12; and (2) a second coating on the substrate's rear major surface 14, and the front coating can optionally be applied at a greater thickness than the rear coating, or vice-versa. Any desired coatings can be deposited.

In certain preferred embodiments, a first of the coatings is a rear coating on the rear major surface 14 of the substrate 10 and the other major surface of the substrate is a front major surface 12, and a second of the coatings is a front coating on the front major surface 12 of the substrate. In the present preferred embodiments, there is provided a method in which the rear coating is applied at a lesser thickness than the front coating. In some embodiments of this nature, the totally physical thickness of the rear coating is less than about 500 angstroms, perhaps more preferably less than about 300 angstroms, and perhaps optimally less than about 200 angstroms. Further, in some embodiments, the coating deposited on the substrate's front surface 12 comprises (e.g., is) a low-emissivity coating. In some embodiments of this nature, the low-emissivity coating comprises at least one silver-containing film deposited between two dielectric films. Thus, related methods of the invention involve depositing, e.g., by operating the front coating apparatus(es) 52, in sequence moving outwardly from the substrate's front surface 12: (1) a dielectric film; (2) a silver-containing film (i.e., a film comprising at least some silver); and (3) a dielectric film. Optionally, the method involves depositing in such sequence: (1) a dielectric film; (2) a silver-containing film (i.e., a film comprising at least some silver); (3) a dielectric film; (4) a silver-containing film; and (5) a dielectric film. In such embodiments, each film can comprise one or more film layers, film regions, etc.

In certain alternate embodiments of the invention, only the rear major surface 14 of the substrate 10 is coated by operating one or more rear coating apparatuses 54 (e.g. front coating apparatus(es) can be omitted or simply not used).

While preferred embodiments of the invention have been described, it should be understood that numerous changes, adaptations and modifications can be made therein without departing from the spirit of the invention and the scope of the appended claims.

What is claimed is:

1. A coater for depositing thin films onto generally-opposed major surfaces of a sheet-like substrate in a single pass of the substrate through the coater, the sheet-like substrate being a sheet of glass having a top edge and a bottom edge, the coater having a substrate transport system adapted for supporting the substrate in a vertical-offset configuration wherein the substrate is offset from vertical by an acute angle greater than about 5 degrees, the transport system defining a path of substrate travel extending through the coater, the transport system being adapted for conveying the substrate along the path of substrate travel while maintaining the substrate in said vertical-offset configuration, the transport system including a side support for supporting a rear surface that is one of the major surfaces of the substrate, the side support having a plurality of wheels adapted to roll directly against the rear major surface of the substrate when the substrate is conveyed along the path of substrate travel, at least a portion of a wheel positioned to roll directly against the rear major surface of the substrate proximate its top edge to support the substrate in the vertical-offset configuration, the side support bounding a passage through which coating material passes when such coating material is deposited onto the substrate's rear major surface, wherein said passage is between at least two of said wheels and the transport system includes a bottom conveyor adapted for receiving the bottom edge of the substrate, wherein the substrate when positioned on the transport system and maintained in the vertical-offset configuration has its bottom edge supported by the bottom conveyor and its rear major surface supported by the side support, the coater including at least one coating apparatus on each of two sides of the path of substrate travel, the coating apparatuses being adapted for depositing coatings onto both of the generally-opposed major surfaces of the substrate in a single pass of the substrate along the path of substrate travel.

2. The coater of claim 1 wherein the coating apparatuses are adapted for depositing said coatings entirely over both major surfaces of the substrate in a single pass of the substrate along the path of substrate travel.

3. The coater of claim 1 wherein said plurality of wheels are provided as an arrangement of wheels spaced vertically and/or horizontally from one another.

4. The coater of claim 1 wherein when the bottom edge of the substrate is received by the bottom conveyor the bottom conveyor is adapted to drive the substrate along the path of substrate travel.

5. The coater of claim 1 wherein the bottom conveyor is motorized.

6. The coater of claim 1 wherein the bottom conveyor defines a support platform that is not perfectly horizontal but rather is offset from horizontal by less than 90 degrees.

7. The coater of claim 6 wherein said support platform is offset from horizontal by less than about 10 degrees.

8. The coater of claim 6 wherein said support platform is offset from horizontal by a predetermined angle that is substantially equal to said acute angle of the substrate when in said vertical-offset configuration.

9. The coater of claim 1 wherein the coater comprises a vacuum deposition chamber adapted for establishing and maintaining an internal vacuous deposition environment.

10. The coater of claim 9 wherein said coating apparatuses comprise vacuum coating devices adapted for carrying out film deposition inside said vacuum deposition chamber.

11. The coater of claim 1 wherein one of the coating apparatuses is a rear coating apparatus that is aligned with said passage such that said operating the coating apparatuses involves operating the rear coating apparatus so as to deliver said coating material from the rear coating apparatus through said passage and onto the substrate's rear major surface.

12. The coater of claim 1 wherein at least one of the coating apparatuses comprises a sputtering target that is aligned with said passage such that bombarding the target with ions causes particles of sputtered material to be ejected from the target through said passage and onto the substrate's rear major surface.

13. The coater of claim 1 wherein the side support comprises a plurality of support surfaces lying in a plane that is not perfectly vertical but rather is offset from vertical by a desired angle that is less than 90 degrees.

14. The coater of claim 13 wherein said desired angle is less than about 10 degrees.

15. The coater of claim 13 wherein said desired angle is substantially equal to said acute angle of the substrate when in said vertical-offset configuration.

16. The coater of claim 1 wherein the coater comprises at least one front sputtering target and at least one rear sputtering target, said front and rear sputtering targets being mounted on opposite sides of the path of substrate travel.

17. The coater of claim 1 wherein the path of substrate travel extends horizontally through the coater.

* * * * *